United States Patent
Tu et al.

(10) Patent No.: US 7,192,797 B2
(45) Date of Patent: Mar. 20, 2007

(54) LIGHT EMITTING DEVICE AND MANUFACTURE METHOD THEREOF

(75) Inventors: Chuan-Cheng Tu, Hsinchu (TW); Jen-Chau Wu, Hsinchu (TW); Yuh-Ren Shieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 11/249,680

(22) Filed: Oct. 12, 2005

(65) Prior Publication Data
US 2006/0169994 A1    Aug. 3, 2006

(30) Foreign Application Priority Data
Feb. 3, 2005  (TW) ............................. 94103370 A

(51) Int. Cl.
*H01L 21/00* (2006.01)
(52) U.S. Cl. .................. 438/28; 257/79; 257/E33.056; 257/E25.032
(58) Field of Classification Search ............... 438/28, 438/29, 34, 47; 257/13, 79, 82, 88, 918
See application file for complete search history.

(56) References Cited

U.S. PATENT DOCUMENTS

| | | | |
|---|---|---|---|
| 6,900,068 B2 * | 5/2005 | Lin et al. ...................... | 438/29 |
| 2004/0188696 A1 | 9/2004 | Hsing Chen et al. | |
| 2004/0203189 A1 | 10/2004 | Chen et al. | |

* cited by examiner

*Primary Examiner*—Quoc Hoang
(74) *Attorney, Agent, or Firm*—Ingrassia, Fisher & Lorenz, P.C.

(57) ABSTRACT

A flip-chip LED including a light emitting structure, a first dielectric layer, a first metal layer, a second metal layer, and a second dielectric layer is provided. The light emitting structure includes a first conductive layer, an active layer, and a second conductive layer. The active layer is disposed on the first conductive layer, and the second conductive layer is disposed on the active layer. The first metal layer is disposed on the light emitting structure and is contact with the first conductive layer, and part of the first metal layer is disposed on the first dielectric layer. The second metal layer is disposed on the light emitting structure and is in contact with the second conductive layer, and part of the second metal layer is disposed on the first dielectric layer. The second dielectric layer is disposed on the first dielectric layer.

20 Claims, 5 Drawing Sheets

LIGHT EMITTING DEVICE AND MANUFACTURE METHOD THEREOF

CROSS REFERENCE TO RELATED APPLICATIONS

This application claims priority to Taiwan Patent Application No. 094103370 entitled "Light Emitting Device and Manufacture Method thereof", filed on Feb. 3, 2005, which is incorporated herein by reference and assigned to the assignee herein.

FIELD OF INVENTION

The present invention relates to a light emitting device and a method for manufacturing the same. In addition, the present invention relates to a light emitting device array and a method for manufacturing the same.

BACKGROUND OF THE INVENTION

For conventional light emitting device (LED) packages, a LED chip is mounted onto the sub-mount using the epoxy put thereon to form a LED element, and the process is called "Die Bonding". Typically, the epoxy used in "Die Bonding" can be silver filled epoxy or other non-conductive resin. Then, the LED elements are assembled onto the circuit board. For a flip-chip LED, the p-type conductive layer and the n-type conductive layer are exposed on the same side to have the positive electrode and the negative electrode on the same side of the LED structure. And the LED structure with the positive electrode and the negative electrode is flipped and disposed on the solder without wire bonding. However, conventional flip-chip LEDs still require "Dicing" and "Die Bonding" for connecting and mounting the circuit board. If the electrodes of flip-chip LEDs have large contact area to be directly connected to the circuit board, a number of conventional packaging processes for LEDs can be skipped.

The operating current of a conventional LED is typically several tens to several hundreds of mAs. Therefore, the brightness of a conventional LED is not suitable for illumination purpose. When lots of LEDs are assembled into an LED lamp to improve the brightness, the volume of the LED lamp increases accordingly, which results in the loss of its market competitiveness. Therefore, to improve the brightness of a single LED is a necessary approach. However, as the LED advances towards high brightness, the operating current and power of a single LED become several times to several hundred times than those that a conventional LED requires. For example, the operating current of a high brightness LED is about several hundreds of mAs to several Amps (A). As a result, the heat generated by the LED becomes an important issue. "Heat" seriously affects the performance of LEDs; for example, the thermal effect influences the wavelength of lights emitted from the LED, reduces the brightness of lights generated from the semiconductor device, and damages the LED device. Therefore, how to dissipate heat generated by the high power LED become the important issue of the LEDs.

U.S. Applications Nos. 2004/0188696 and 2004/0203189 disclosed a LED package and the method for manufacturing the same based on the Surface Mount Technology (SMT). Each LED package includes a LED chip, and each chip is flip-chip bonded onto a frontside of the sub-mount wafer using boning bump. A plurality of arrays of openings are drilled into the electrically insulating sub-mount wafer. A metal is applied to the drilled openings to produce a plurality of via arrays. The p-type and n-type contacts of each flip-chip bonded LED electrically communicate with a solderable backside of the sub-mount wafer through a via array. A thermal conduction path is provided for thermally conducting heat from the flip-chip bonded LED chip to the solderable backside of the sub-mount wafer. Subsequent to the flip-chip bonding, the sub-mount wafer is separated to produce the surface mount LED packages.

However in U.S. Applications Nos. 2004/0188696 and 2004/0203189, it requires drilled via array with filled metal within the sub-mount wafer and thus increases the manufacturing cost. Furthermore, it becomes complicated to flip-chip bond each chip onto the sub-mount wafer using bonding bump. Therefore, it would be beneficial if the LED packages have excellent thermal conductive paths without the provision of the sub-mount wafers.

SUMMARY OF THE INVENTION

One aspect of the present invention is to provide a structure of the light emitting device which facilitates the light emitting efficiency of the LED.

Another aspect of the present invention is to provide a LED in which the electrodes are effective thermal conductive paths.

A further aspect of the present invention is to provide a LED in which the electrodes connect directly to the circuits of the circuit board.

A still further aspect of the present invention is to provide a LED array and a method for manufacturing the same. The LED array includes a plurality of LED on a substrate, and the electrodes of each LED connect directly to the circuits of the circuit board.

In one embodiment, the present invention provides a method of forming a light emitting device (LED). The method includes: (a) forming a light emitting structure, the light emitting structure comprising a first conductive layer, an active layer, and a second conductive layer, the active layer being disposed on the first conductive layer and being a light emitting layer, the second conductive layer being disposed on the active layer; (b) forming a first dielectric layer on the light emitting structure; (c) forming a second dielectric layer on the first dielectric layer; (d) forming a first metal layer, the first metal layer being disposed on the light emitting structure and electrically-connected to the first conductive layer, a portion of the first metal layer being disposed on the first dielectric layer; and (e) forming a second metal layer, the second metal layer being disposed on the light emitting structure and electrically-connected to the second conductive layer, a portion of the second metal layer being disposed on the first dielectric layer. The first dielectric layer and the second dielectric layer electrically-isolate the first metal layer from the second metal layer. A portion of the first dielectric layer is a transparent layer, and a surface of the first dielectric layer contacting the first metal layer and/or the second metal layer is provided for reflecting the light emitted from the light emitting structure.

In another embodiment, the present invention provides a light emitting device. The LED includes a light emitting structure, a first dielectric layer, a first metal layer, a second metal layer, and a second dielectric layer. The light emitting structure includes a first conductive layer, an active layer, and a second conductive layer. The active layer is disposed on the first conductive layer and is a light emitting layer. The second conductive layer is disposed on the active layer. The first dielectric layer is disposed on the light emitting structure. The first metal layer is disposed on the light emitting structure and is electrically-connected to the first conductive layer. A portion of the first metal layer is disposed on the first dielectric layer. The second metal layer is disposed on the light emitting structure and is electrically-connected to the second conductive layer. A portion of the second metal layer is disposed on the first dielectric layer. The second dielectric layer is disposed on the first dielectric layer. The first dielectric layer and the second dielectric layer electrically-isolate the first metal layer from the second metal layer. A portion of the first dielectric layer is a transparent layer, and a surface of the first dielectric layer contacting the first metal layer and/or the second metal layer is provided for reflecting the light emitted from the light emitting structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1A:
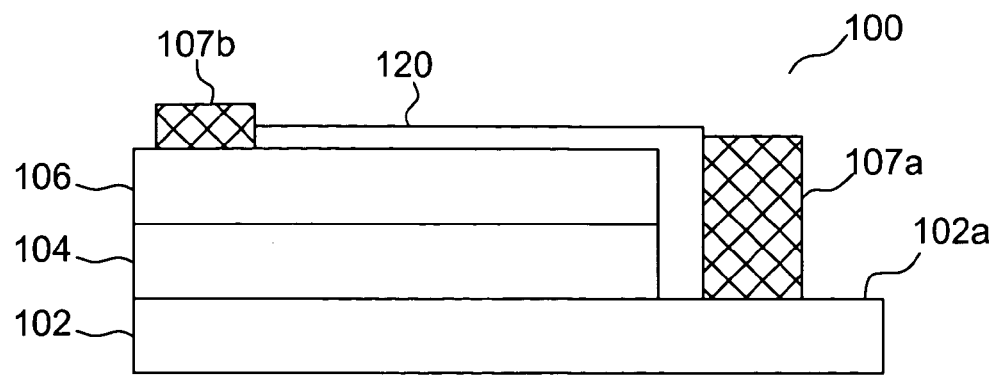
FIGS. 1A–D illustrate cross-sectional views of forming a light emitting device (LED) in accordance with one embodiment of the present invention.

FIGS. 1A–1D illustrate the method for forming a light emitting device (LED) according to one embodiment of the present invention. Referring to FIG. 1A, at first, a light emitting structure 100 is formed. The light emitting structure 100 includes a first conductive layer 102 as a cladding layer, an active layer 104 disposed on the layer 102 as a light emitting layer, and a second conductive layer 106 disposed on the layer 104 as another cladding layer. Preferably, as shown in FIG. 1, a bonding pad 107a is disposed on an exposed portion of the layer 102, and another bonding pad 107b is disposed on the layer 106. The manufacture method and the material (e.g., Aluminum) of bonding pads 107a and 107b are well known to those skilled in the art and thus are omitted hereinafter. Furthermore, in one embodiment, the light emitting structure 100 includes a passivation layer 120 to protect the light emitting structure 100. Also, the manufacture method and the material (e.g., SiO$_2$) of passivation layer 120 are well known to those skilled in the art and thus omitted hereinafter.

The first conductive layer 102 is an n-type semiconductor conductive layer, and the second conductive layer 106 is a p-type semiconductor conductive layer. The n-type semiconductor conductive layer 102 and the p-type semiconductor conductive layer 106 can be embodied as any semiconductor materials known to those skilled in the art, preferably as III-V group compound semiconductor, such as $Al_xGa_yIn_{1-x-y}N$, wherein $0 \leq x \leq 1$, $0 \leq y \leq 1$, $0 \leq x+y \leq 1$, and can be doped with P/N type dopants. Light emitting layer 104 can embodied with conventional materials (e.g., AlGaInN or AlGaInP) and structures (e.g., Single Quantum Well, Multiple Quantum Well, and Double Heterosture). The principles and mechanisms of the light emitting layer 104 are known to those skilled in the art and thus omitted hereinafter. In addition, the light emitting structure 100 can be manufactured via the process of MOCVD, molecular beam epitaxy (MBE), or hydride vapor phase epitaxy (HVPE).

Figure 1B:
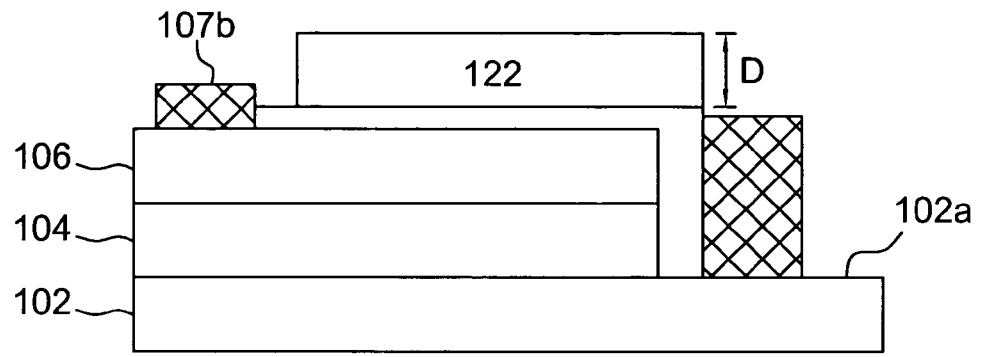

Next, as shown in FIG. 1B, a first dielectric layer 122 is formed on the light emitting structure 100. Preferably, the layer 122 is a transparent dielectric layer with the thickness $D \leq 20$ μm, and the heat generated from the light emitting structure 100 can be easily conducted. The layer 122 can be formed with the material such as $SiO_2$, $Si_3N_4$, or the combination of them, and via the processes of MOCVD or MBE.

Figure 1C:
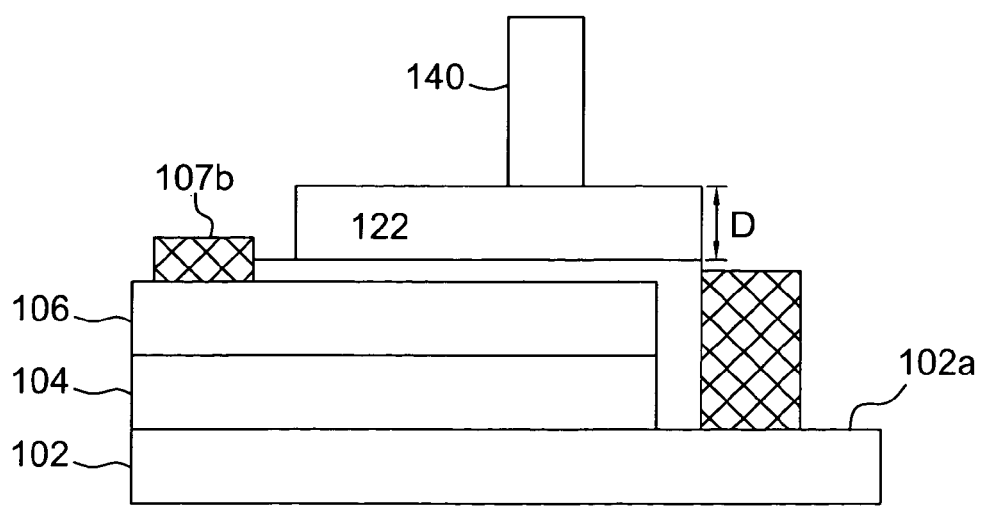

As shown in FIG. 1C, a second dielectric layer 140 is formed on the first dielectric layer 122. The layer 140 can be formed with the material such as $SiO_2$, silicon-nitride, polymider, bisbenzocyclobutene, or photoresist. Preferably, the thickness of the layer 140 is about 25 μm, and the layer 140 is formed by using a printing technology.

Figure 1D:
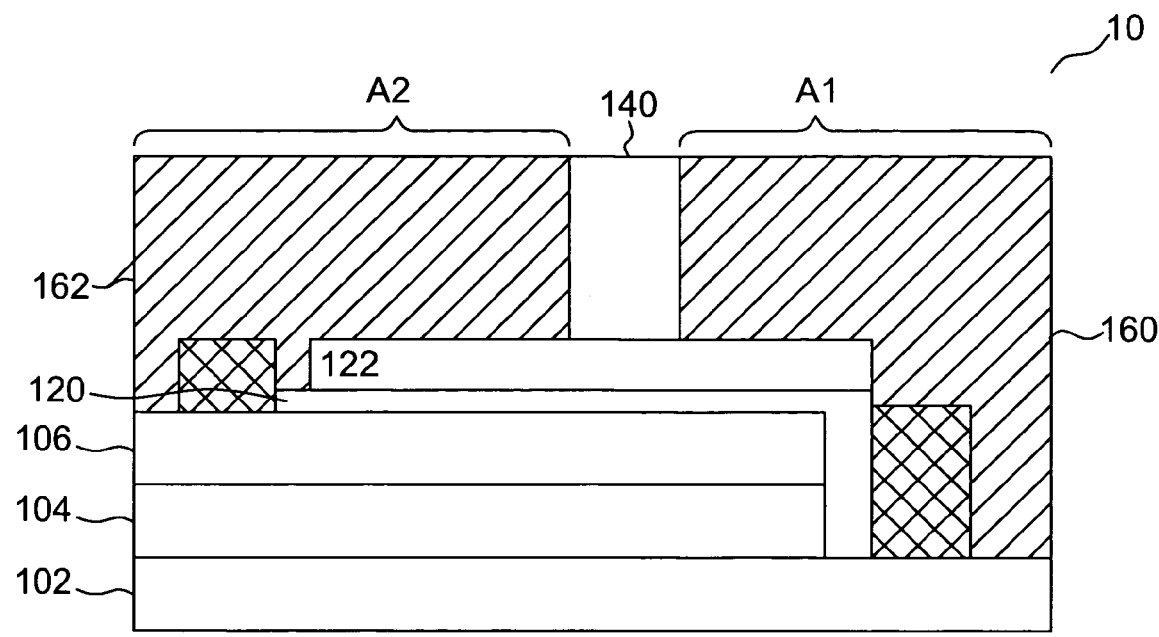

As shown in FIG. 1D, the metal layer 160 is formed after the layer 140 is formed. The metal layer 160 is disposed on the light emitting structure 100 and is electrically connected to the first conductive layer 102. A portion of the metal layer 160 is disposed on the first dielectric layer 122. Also the metal layer 162 is formed on the on the light emitting structure 100 and is electrically connected to the second conductive layer 106. A portion of the metal layer 162 is disposed on the first dielectric layer 122. Meanwhile, the first dielectric layer 122 and the second dielectric layer 140 electrically isolate the metal layer 160 from the metal layer 162. The metal layer 160 or the metal layer 162 can be embodied with materials of Au, Al, Ag, or Alloy of them. Preferably, the metal layer 160 and the metal layer 162 are formed together by using a printing technology. After that, the manufacture process for LED 10 is completed.

In one embodiment, the dielectric layer 122 is a transparent dielectric layer. A surface of the dielectric layer 122 contacting the metal layer 160 and/or the metal layer 162 is provided for reflecting the light emitted from the light emitting structure 100. Furthermore, the metal layer 160 and/or the metal layer 162 are thermal conductive paths for the light emitting structure 100. Large contact areas A1 and A2 of the metal layer 160 and the metal layer 162 are also beneficial to the heat dissipation.

Figure 1E:
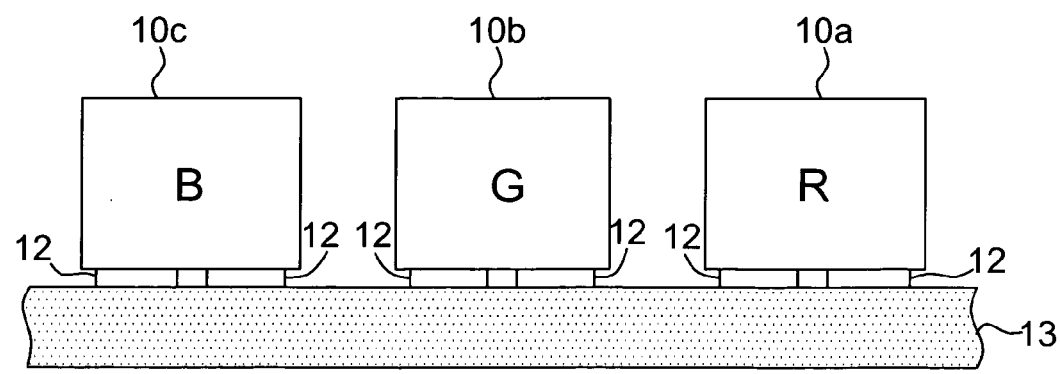
FIG. 1E illustrates LEDs in accordance with an embodiment of the present invention.

Like the LED 10 in FIG. 1D, LED 10a, 10b, and 10c shown in FIG. 1E, are provided with large contact areas, each of which is preferably larger than half of the section area of the LED 10. LED 10a, 10b, and 10c are directly connected to the circuit board 13 by using solder 12 instead of by "Die Bonding" and "Wire Bonding". In another embodiment, LED 10a is provided for emitting red light, LED 10b for emitting green light, and LED 10c for emitting blue light. Thus LED 10a, 10b, and 10c, when connected to the circuit boards 13, can be used in the image display application.

Figure 2A:
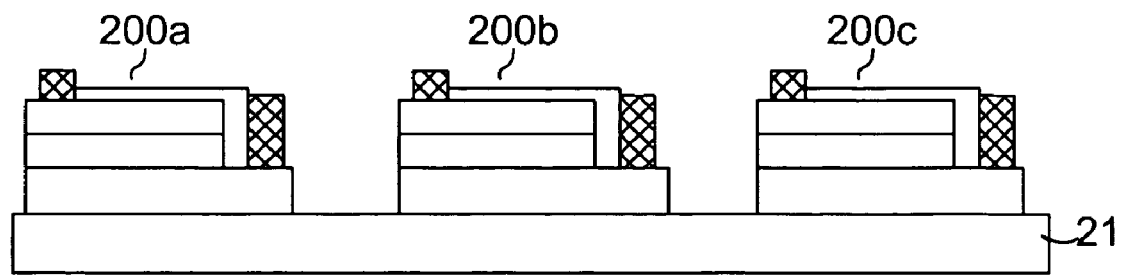
FIGS. 2A–2D illustrate cross-sectional views of forming a LED array in accordance with one embodiment of the present invention.

FIGS. 2A–2D illustrate the method for forming a light emitting device (LED) array according to one embodiment of the present invention. Referring to FIG. 2A, at first, a substrate 21 is provided. The substrate 21 can be Sapphire substrate, GaAs substrate, or other substrates known to those skilled in the art, or the combinations of them. Next, a plurality of light emitting structures 200a, 200b, and 200c are formed on the substrate 21. The materials and the manufacture processes for light emitting structures 200a, 200b, and 200c can be referred to the elaboration for light emitting structure 100 illustrated by FIGS. 1A–1D. Similarly, light emitting structures 200a, 200b, and 200c can be manufactured via the process of MOCVD, molecular beam epitaxy, or hydride vapor phase epitaxy.

Figure 2B:
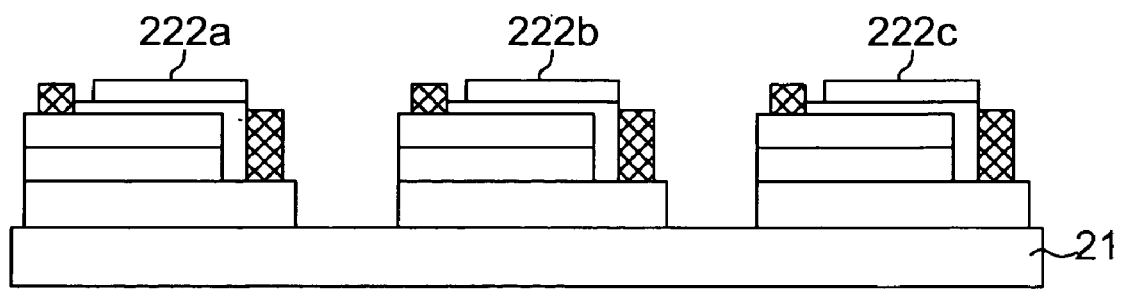

Next, as shown in FIG. 2B, a dielectric layer 222a is formed on the light emitting structure 200a, a dielectric layer 222b is formed on the light emitting structure 200b, and a dielectric layer 222c is formed on the light emitting structure 200c. Preferably, like the layer 122 shown in FIG. 1B, layers 222a, 222b, and 222c are transparent dielectric layers with each thickness $D \leq 20$ μm, and the heat generated from the light emitting structures 200a, 200b, and 200c can be easily conducted away. The layers 222a, 222b, and 222c can be formed with the material such as $SiO_2$, $Si_3N_4$, or the combination of them, and via the processes of MOCVD or MBE.

Figure 2C:
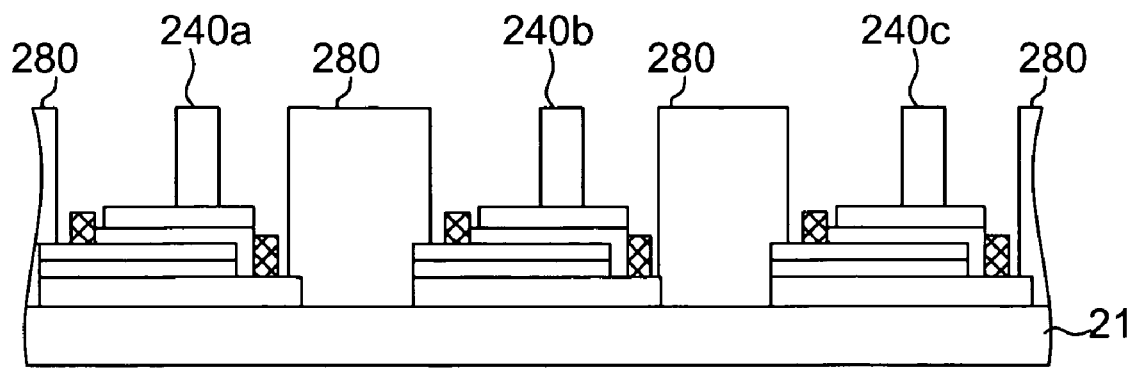
Figure 2D:
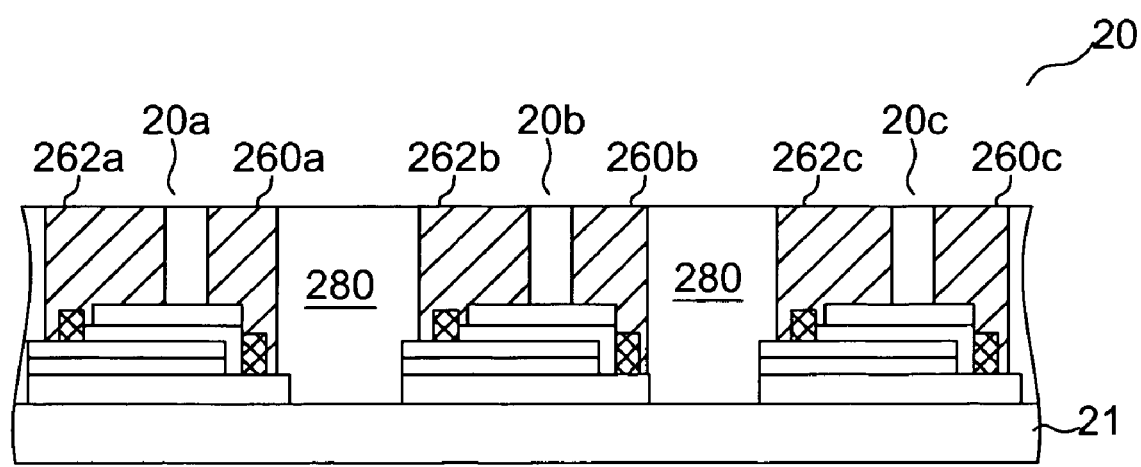

Later, as shown in FIG. 2C, a dielectric layer 240a is formed on the dielectric layer 222a, a dielectric layer 240b is formed on the dielectric layer 222b, and a dielectric layer 240c is formed on the dielectric layer 222c. The layers 240a, 240b, and 240c can be formed with the material such as SiO2, silicon-nitride, polymider, bisbenzocyclobutene, or photoresist. Preferably, like the layer 140 in FIG. 1C, the thickness of the layers 240a, 240b, and 240c are about 25 μm respectively, and the layers 240a, 240b, and 240c are formed by using a printing technology. In one embodiment, a dielectric layer 280 is further formed between light emitting structures 200a, 200b, and 200c to electrically isolate LEDs 20a, 20b, and 20c from each other (as shown in FIG. 2D). The dielectric layer 280 can be embodied with the same material (e.g., polyimide) with the layer 240a, 240b, or 240c, and is formed together with them by using a printing technology. Alternatively, the dielectric layer 280 can be embodied with the different material with the layer 240a, 240b, or 240c, and is formed through a different process.

As shown in FIG. 2d, metal layers 260a, 260b, 260c, 262a, 262b, and 262c are formed and can be embodied with materials of Au, Al, Ag, or Alloy of them. Preferably, metal layers 260a, 260b, 260c, 262a, 262b, and 262c are formed together by using a printing technology. After that, the manufacture process for LED array 10 including LEDs 20a, 20b, and 20c is completed.

Figure 2E:
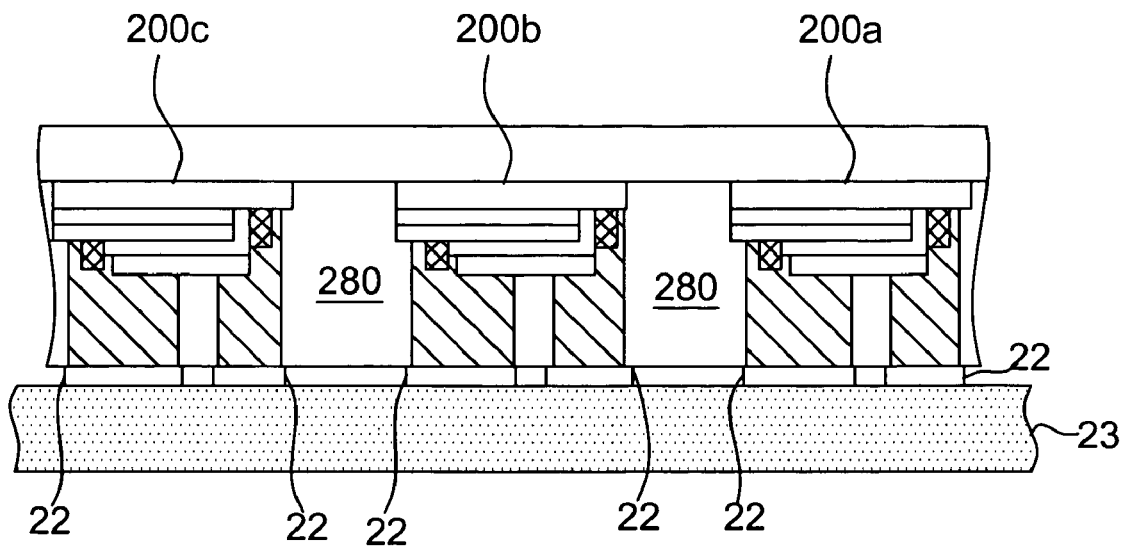
FIG. 2E illustrates the LED array connected to the circuit board in accordance with another embodiment of the present invention.
Figure 2F:
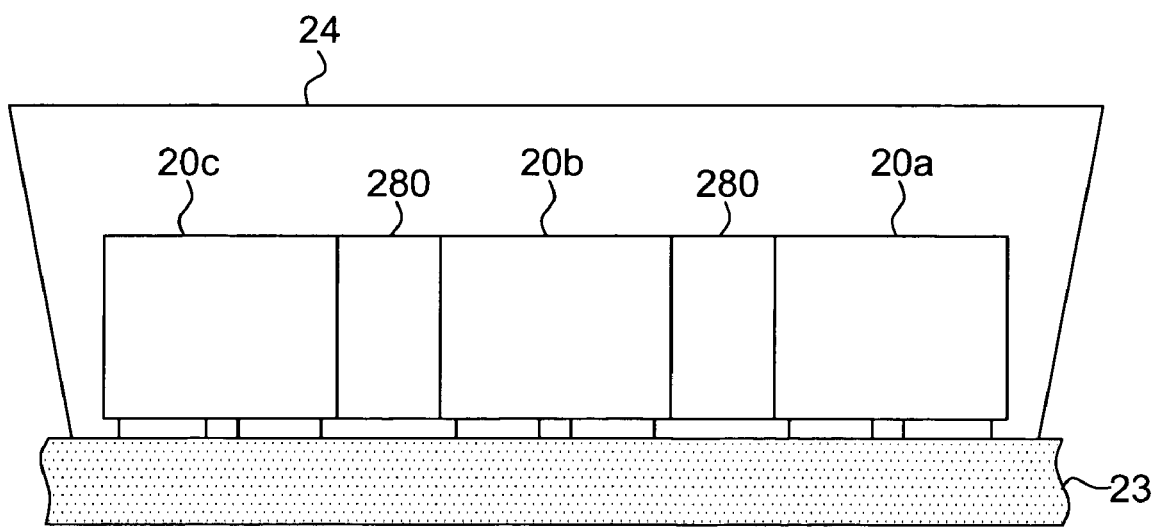
FIG. 2F illustrates a LED array package in accordance with an embodiment of the present invention.

As shown in FIG. 2E, LED 20a, 20b, and 20c are provided with large contact areas, and are directly connected to the circuit board 23 by using solders 22. Thereafter, LED array 20 can be separated from the substrate 21 by using a conventional means (e.g., using Excimer Laser) and used in the image display application. Compared with the conventional LEDs used in the image display application, the separation or the gap between LEDs 20a, 20b, and 20c are decreased because the steps of slicing and packaging are omitted. Therefore, the present invention provides higher resolution in the image display. In another embodiment, as shown in FIG. 2F, the package 24 encloses the LED array 20 (including LEDs 20a, 20b, and 20c) connected to the circuit board 23.

Although specific embodiments have been illustrated and described, it will be obvious to those skilled in the art that various modifications may be made without departing from what is intended to be limited solely by the appended claims.

What is claimed is:

1. A method of forming a light emitting device (LED), comprising:
    forming a light emitting structure, said light emitting structure comprising a first conductive layer, an active layer, and a second conductive layer, said active layer being disposed on said first conductive layer and being a light emitting layer, said second conductive layer being disposed on said active layer;
    forming a first dielectric layer on said light emitting structure;
    forming a second dielectric layer on said first dielectric layer;
    forming a first metal layer, said first metal layer being disposed on said light emitting structure and electrically-connected to said first conductive layer, a portion of said first metal layer being disposed on said first dielectric layer; and
    forming a second metal layer, said second metal layer being disposed on said light emitting structure and electrically-connected to said second conductive layer, a portion of said second metal layer being disposed on said first dielectric layer;
    wherein said first dielectric layer and said second dielectric layer electrically-isolate said first metal layer from said second metal layer;
    wherein a portion of said first dielectric layer is a transparent layer, and a surface of said first dielectric layer contacting said first metal layer and/or said second metal layer is provided for reflecting the light emitted from said light emitting structure.

2. The method of claim 1, wherein said first metal layer is a first electrode and said second metal layer is a second electrode;
    wherein said first metal layer and/or said second metal layer are thermal conductive paths for said light emitting structure.

3. The method of claim 1, wherein a thickness of said transparent layer, $D \leq 20$ μm.

4. The method of claim 1, wherein said first metal layer and/or said second metal layer are formed by using a printing technology.

5. The method of claim 1, wherein said second dielectric layer is formed by using a printing technology.

6. A method of forming a light emitting device array, comprising:
    providing a substrate;
    forming a plurality of light emitting devices, wherein the steps for forming each light emitting device comprise:
    forming a light emitting structure on said substrate, said light emitting structure comprising a first conductive layer, an active layer, and a second conductive layer, said active layer being disposed on said first conductive layer and being a light emitting layer, said second conductive layer being disposed on said active layer;
    forming a first dielectric layer on said light emitting structure;
    forming a second dielectric layer on said first dielectric layer;
    forming a first metal layer, said first metal layer being disposed on said light emitting structure and electrically-connected to said first conductive layer, a portion of said first metal layer being disposed on said first dielectric layer; and
    forming a second metal layer, said second metal layer being disposed on said light emitting structure and electrically-connected to said second conductive layer, a portion of said second metal layer being disposed on said first dielectric layer;
    wherein, for each light emitting device, said first dielectric layer and said second dielectric layer electrically-isolate said first metal layer from said second metal layer;
    wherein, for each light emitting device, a portion of said first dielectric layer is a transparent layer, and a surface of said first dielectric layer contacting said first metal layer and/or said second metal layer is provided for reflecting the light emitted from said light emitting structure.

7. The method of claim 6, wherein, for each light emitting device, said first metal layer is a first electrode and said second metal layer is a second electrode;
wherein said first metal layer and/or said second metal layer are thermal conductive paths for said light emitting structure.

8. The method of claim 6, wherein, for each light emitting device, said first metal layer and/or said second metal layer are formed by using a printing technology.

9. The method of claim 6, wherein, for each light emitting device, said second dielectric layer is formed by using a printing technology.

10. The method of claim 6, further comprising:
forming a third dielectric layer for isolating said plurality of light emitting devices from each other.

11. The method of claim 6, wherein said plurality of light emitting devices comprise at least a red LED, a green LED, and a blue LED.

12. A light emitting device, comprising:
a light emitting structure, said light emitting structure comprising a first conductive layer, an active layer, and a second conductive layer, said active layer being disposed on said first conductive layer and being a light emitting layer, said second conductive layer being disposed on said active layer;
a first dielectric layer on said light emitting structure;
a first metal layer, said first metal layer being disposed on said light emitting structure and electrically-connected to said first conductive layer, a portion of said first metal layer being disposed on said first dielectric layer; and
a second metal layer, said second metal layer being disposed on said light emitting structure and electrically-connected to said second conductive layer, a portion of said second metal layer being disposed on said first dielectric layer;
a second dielectric layer on said first dielectric layer, wherein said first dielectric layer and said second dielectric layer electrically-isolate said first metal layer from said second metal layer;
wherein a portion of said first dielectric layer is a transparent layer, and a surface of said first dielectric layer contacting said first metal layer and/or said second metal layer is provided for reflecting the light emitted from said light emitting structure.

13. The light emitting device of claim 12, wherein said first metal layer is a first electrode and said second metal layer is a second electrode.

14. The light emitting device of claim 13, wherein said first metal layer and/or said second metal layer are thermal conductive paths for said light emitting structure.

15. The light emitting device of claim 12, wherein said first metal layer and/or said second metal layer are thermal conductive paths for said light emitting structure.

16. The light emitting device of claim 12, wherein a thickness of said transparent layer, $D \leqq 20$ μm.

17. A light emitting device array, comprising:
a substrate;
a plurality of light emitting devices disposed on said substrate, each light emitting device comprising:
a light emitting structure, said light emitting structure comprising a first conductive layer, an active layer, and a second conductive layer, said active layer being disposed on said first conductive layer and being a light emitting layer, said second conductive layer being disposed on said active layer;
a first dielectric layer on said light emitting structure;
a first metal layer, said first metal layer being disposed on said light emitting structure and electrically-connected to said first conductive layer, a portion of said first metal layer being disposed on said first dielectric layer; and
a second metal layer, said second metal layer being disposed on said light emitting structure and electrically-connected to said second conductive layer, a portion of said second metal layer being disposed on said first dielectric layer;
a second dielectric layer on said first dielectric layer, wherein, for each light emitting device, said first dielectric layer and said second dielectric layer electrically-isolate said first metal layer from said second metal layer;
wherein, for each light emitting device, a portion of said first dielectric layer is a transparent layer, and a surface of said first dielectric layer contacting said first metal layer and/or said second metal layer is provided for reflecting the light emitted from said light emitting structure.

18. The light emitting device array of claim 17, wherein, for each light emitting device, said first metal layer is a first electrode and said second metal layer is a second electrode;
wherein said first metal layer and/or said second metal layer are thermal conductive paths for said light emitting structure.

19. The light emitting device array of claim 17, further comprising a third dielectric layer for isolating said plurality of light emitting devices from each other.

20. A light emitting device array of claim 17, wherein said plurality of light emitting devices comprise at least a red LED, a green LED, and a blue LED.

* * * * *